United States Patent [19]
McKean et al.

[11] Patent Number: 5,520,320
[45] Date of Patent: May 28, 1996

[54] PROCESS FOR WAVE SOLDERING COMPONENTS ON A PRINTED CIRCUIT BOARD IN A TEMPERATURE CONTROLLED NON-OXIDIZING ATMOSPHERE

[75] Inventors: Kevin McKean, Naperville, Ill.; Frederic Rotman, Paris, France; Robert W. Connors, Western Springs, Ill.

[73] Assignees: Air Liquide America Corporation, Walnut Creek, Calif.; L'Air Liquide Societe Anonyme pour l'Etude et l'Exploitation des Procedes Georges Claude, Paris, France

[21] Appl. No.: 231,068

[22] Filed: Apr. 22, 1994

[51] Int. Cl.$^6$ .............................. B23K 35/38; H05K 3/34
[52] U.S. Cl. .......................... 228/102; 228/219; 228/232; 228/260
[58] Field of Search .................................... 228/219, 260, 228/232, 102

[56] References Cited

U.S. PATENT DOCUMENTS

| | | | |
|---|---|---|---|
| 3,386,166 | 6/1968 | Tardoskegyi | 228/232 |
| 3,605,244 | 9/1971 | Osborne et al. | 228/260 |
| 4,746,289 | 5/1988 | Guillaume | 432/8 |
| 5,090,651 | 2/1992 | Mittag | 228/219 |
| 5,121,875 | 6/1992 | Hagerty et al. | 228/219 |
| 5,203,489 | 4/1993 | Gileta et al. | 228/219 |
| 5,230,460 | 7/1993 | Deamborsio et al. | 228/232 |
| 5,297,724 | 3/1994 | Metha et al. | 228/219 |
| 5,320,274 | 6/1994 | Precious et al. | 228/219 |
| 5,409,159 | 4/1995 | Connors et al. | 228/219 |

*Primary Examiner*—P. Austin Bradley
*Assistant Examiner*—Jeffrey T. Knapp
*Attorney, Agent, or Firm*—Burns, Doane, Swecker and Mathis

[57] ABSTRACT

The present invention relates to a wave soldering process wherein an inert gas atmosphere is injected inside the wave soldering machine, the inert gas atmosphere having a temperature which might be controlled. Particularly, the atmosphere can be heated at the same or different temperatures before injection, for example in the preheating zones, in the machine. The atmosphere can also be cooled (or injected at ambient temperature) e.g. in the cooling zone. Various atmospheres can be used (similar or different from one zone to another). Also, maintaining the atmosphere under forced laminer flow conditions improves the quality of the solder joints. The thermal efficiency of the heat transfer between the atmosphere and the printed circuit boards is thus greatly enhanced, which means less solder defects, higher components density and decrease of energy consumption and inert gas flow rate.

23 Claims, 5 Drawing Sheets

PROCESS FOR WAVE SOLDERING COMPONENTS ON A PRINTED CIRCUIT BOARD IN A TEMPERATURE CONTROLLED NON-OXIDIZING ATMOSPHERE

FIELD OF THE INVENTION

This invention relates to aprocess for wave soldering components on a printed circuit board, wherein the temperature of the substantially non-oxidizing atmosphere is controlled before and/or during its injection in the wave soldering machine in order to increase the thermal efficiency of the heat transfer from the atmosphere to the printed circuit board.

DESCRIPTION OF THE PRIOR ART

Wave soldering machines have been introduced for a long time in the industry to automatically solder components on a printed circuit board which operation was previously done by hand. A typical wave soldering machine comprises at least one preheating zone to preheat the printed circuit board, at least one soldering zone to solder the components to the board by coating the bottom side of the printed circuit board with molten solder contained in a solder pot, and at least one cooling zone where the solder is solidified. This soldering process, or coating process, is usually conducted in the presence of a fluxing agent which agent is used to improve the wetting of the metallic surfaces on the bottom of the printed circuit board, which surfaces need to be joined or coated. The fluxing agents are usually corrosive and the excess or residue of these agents must be cleaned after the wave soldering operation.

Low residue no clean fluxes or flux-less processes have been developed wherein it is possible to carry out the wave soldering process without the inconvenience of standard fluxing agents, under a substantially oxygen-free atmosphere, such as nitrogen.

U.S. Pat. No. 3,705,547 discloses one of the earliest wave soldering processes, including injection of an inert gas to avoid oxidation of the metallic surfaces of the printed circuit board.

U.S. Pat. No. 4,538,757 discloses a wave soldering process under a reducing atmosphere comprising nitrogen and hydrogen, and nitrogen curtains at entrance and exit of the machine to inhibit atmosphere exchange with the ambient air.

U.S. Pat. No. 4,606,493 discloses a method and apparatus for soldering printed circuit board under an inert gas atmosphere to prevent oxidation of the electrical (usually in lead-tin coated copper) connections due to the heat produced during soldering and reduce thermal stress defects from occurring in the circuit carrier. To this end, an inert gas is injected through slits to provide a plurality of jets of high velocity which impinge the bottom side of the printed circuit board. As a condition of operation, the temperature of the inert gas jets is about twice as high as the temperature of the molten solder in the solder pot (600° C.).

U.S. Pat. No. 4,646,958 discloses a solder reflow, or solder chip process which is carried out in a flux-less or flux free system, under an atmosphere comprising nitrogen and silane, or hydrogen and silane.

U.S. Pat. No. 4,821,947 discloses a process to coat a molten metal on a metal comprising surface without using a flux. This process is carried out in an inert atmosphere in which the temperature is sufficiently low that to avoid damaging to the metal comprising surface, and wherein no damage is done to materials such as components adjacent to the metal comprising surface.

U.S. Pat. No. 5,071,058 discloses a process for conducting a joining/coating operation which is carried out in a controlled oxidizing atmosphere, having an oxidation capability greater than that required to oxidize a metal comprising filler material used for joining or coating, but having less oxidation capability than that of air. In case of a wave soldering process the oxygen content in the inert gas atmosphere is at least 10 ppm and preferably at least 500 ppm.

U.S. Pat. No. 5,121,875 discloses a short hood for wave soldering machines, wherein preheating of the printed circuit boards is carried out under air. In this process a no clean flux is used and an oxygen concentration which is less than 5% is recommended at the solder pot.

U.S. Pat. No. 4,921,156 discloses an apparatus having a soldering chamber and comprising means to inject a protective gaseous atmosphere in said soldering chamber and sealing skirt means protruding downwardly into the pool of molten metal solder. Preferably the protective gaseous atmosphere is comprised of nitrogen and possibly of some reducing agent.

U.S. Pat. No. 4,746,289 discloses a process for treating parts under a non-reactive atmosphere with laminar flow conditions.

New developments in the wave soldering processes are disclosed in U.S. Pat. Nos. 5,203,489 and 5,240,169. With this wave soldering process, it is possible to use surface mounted components, to be placed on the bottom side of the board before soldering. This new technology has two major benefits. One is to allow for more components per square inch to be placed on the bottom of the circuit board. The second is to eliminate defects associated with through hole components such as insufficient top side filets and voids in the via barrel. Because these new components are much smaller than the traditional through hole components they replace, the thermal shock they can withstand is greatly reduced. A normal maximum ramp temperature for such components is 2° C./sec. Due to this, the preheating temperature of a standard wave soldering machine must be decreased in order not to damage components, but by doing this the through hole components may not reach the proper temperature, thus increasing the defect rate.

Under general manufacturing conditions, a circuit board may contain pin through holes (PTH) as well as surface mount components (SMT). This type of board is called a mixed technology board. The PTH components may vary greatly in size and mass, and material such as heat sinks made of metal and connectors made of plastic. The SMT components by comparison are very small with very little mass. The problem of mixed technology is that of temperature differential increasing the defect rate. These defects come in two main categories. The first is over-heating of SMT components, the second is under heating PTH components, thus causing insufficient solder joints. Because of the predominance of mixed technology boards in industry, there is a requirement to solve the problem of large temperature differentials across the circuit board.

Moreover there exists a problem of varying board assembly types being soldered in same machine in a continuous process. When small boards with relatively light components are to be soldered in the same process line as large boards with relatively heavy components, there is a problem of maintaining the proper temperature profile for both types of boards. One solution is to use multiple temperature profiles, but this solution will decrease the machine throughput, thus increasing unit cost. The other solution is to use the same temperature profile. This solution has the drawback of increasing the defect rate.

As more assemblers use varying board types and component types, this problem will become even greater. Thus a solution is needed to allow for varying board and component types without sacrificing quality on throughput.

Also, by increasing the number of products processed, the set-up time required for each product will increase thus decrease the machine throughput. This will increase the product cost even more.

One of the aims of soldering components on a printed circuit board, with a wave soldering machine, whether it is with through hole component or SMT components is to achieve uniformly high quality solder joints. Better quality of solder joints means more homogeneous solder joints to decrease the electrical connections defects of components on the printed circuit boards. This can be achieved by avoiding solder skips, voids of solder in barrels of through hole components, and also insufficient top side filets. All the different processes disclosed hereabove regarding wave soldering of through hole components are still not yet entirely satisfactory regarding quality of solder joints and there is still a need in the industry to improve the wave soldering process in order to achieve a better quality of the solder joints.

SUMMARY OF THE INVENTION

The process of the present invention aims at increasing the thermal efficiency of the heat transfer from the surrounding atmosphere to the printed circuit board by controlling the temperature of the incoming atmosphere in order to improve the quality of solder joints. According to one embodiment of the invention, the substantially non-oxidizing atmosphere which is injected into the wave soldering machine is preheated in certain areas of the machine, such as the preheating zones, and is cooled to substantially ambient temperature in other areas of the machine such as the cooling zone and/or the wave zone.

When a hot substantially non-oxidizing atmosphere is injected in zones such as at least one of the preheating zones of the wave soldering machine, the process according to the invention uses laminar forced convection flow, which is preferably substantially perpendicular to the printed circuit board and radiation to heat the printed circuit board, whereas on the contrary, the prior art used free convection, sometimes associated with radiation. The term laminar forced convection flow means a flow having a Reynolds number between 500 and 2,500 for each distribution zone. Higher Reynolds numbers may be sometimes required at the entrance zone to promote greater heat transfer.

One of the aims of preheating the atmosphere injected in the wave soldering machine is to decrease the temperature gradient between the printed circuit board and the solder pot at the time where the printed circuit board contacts the molten solder. If this temperature gradient in the area of the solder wave is as small as possible, the molten solder has enough time to penetrate into the different areas, including the holes through the printed circuit board, and fill all these areas and holes before being solidified, while in the case where the temperature of the printed circuit board is too low, the molten solder is about immediately solidified, and the quality of the solder joint is bad, which increases the number of circuits which are rejected at quality control step after this wave soldering step.

According to the invention, it has been discovered that the atmosphere in the zones of the wave soldering machine which are upstream to the solder pot and particularly in the vicinity of the printed circuit boards should be maintained in laminar flow conditions and its temperature controlled between 20° C. and 250° C. (preferably 80° C. to 200° C.) in order to improve the quality of the solder joints. However, in order to avoid damaging the printed circuit boards, it is, according to one embodiment of the invention, recommended to cool the printed circuit board as soon as the soldering step is completed which is usually shortly after the end of the contact between the molten solder and the printed circuit board above the solder pot. In order to achieve this cooling step, it is recommended to inject an atmosphere having a temperature which is lower than the temperature of the atmosphere injected in the preheating zone or in the solder zone.

The invention also relates to a process for providing a substantially non-oxidizing atmosphere in a wave soldering machine, wherein through holes components and SMT components, or both, are electrically and mechanically connected to a printed circuit board by a solder in liquid state which is further solidified in order to electrically connect and mechanically maintain the components on the printed circuit board, said machine comprising at least one preheating zone to preheat the printed circuit boards, at least one soldering zone to solder the components to the board and at least one cooling zone to cool and solidify the solder, wherein the temperature of said substantially non-oxidizing atmosphere is controlled before and/or during its injection in said soldering machine in order to increase the thermal efficiency of the heat transfer from the atmosphere to the printed circuit board.

This temperature controlled, substantially non-oxidizing atmosphere can be injected in at least one zone of the wave soldering machine, preferably in all the zones of said wave soldering machine.

According to a preferred embodiment of the invention, the temperature of the substantially non-oxidizing atmosphere is greater than the ambient temperature and is injected in at least one of the preheating zones of the wave soldering machines.

According to another embodiment, the temperature of the substantially non-oxidizing atmosphere is lower than, or equal to, the ambient temperature and is injected in at least one of the cooling zones of the wave soldering machine.

According to another aspect of the invention the temperature of the substantially non-oxidizing atmosphere injected in the various zones of the wave soldering machine can be different from one zone to another, but is preferably substantially the same. Similarly the composition of the substantially non-oxidizing atmosphere injected in the various zones of the wave soldering machine can be different from one zone to another, or can be identical.

According to another embodiment of the invention, wherein a substantially non-oxidizing atmosphere is injected in a wave soldering machine comprising at least two preheating zones, the temperature of the atmosphere injected in the different preheating zones is different from one zone to another.

According to a preferred embodiment of the invention, the temperature of the temperature controlled substantially non-oxidizing atmosphere is maintained at a preset value, this preset value being the same or being different from one zone to another. Usually, this preset value is the same for all the zones of the wave soldering machine where a heated atmosphere is needed. This preset temperature value is chosen usually in accordance with the process temperature profile, as exemplified on FIG. 2.

According to the invention the temperature of the printed circuit board is gradually increased to reach a maximum in the solder zone, and is then gradually decreased.

The preheated gas atmosphere can be injected on the top side of the printed circuit boards or on the bottom side of the printed circuit board, or on both sides depending on the requirement of the circuit board, i.e. the mass of the assembly and the distribution of the mass of the assembly. (One of the advantages of the invention is that it is no longer necessary to put an additional heat sink which is thereafter removed by the operator, on the small components of circuit boards having otherwise a component permanently covered by a heat sink). When the preheated gas is injected on only one side of the printed circuit boards, it is possible on the other side either to provide some heating means to heat the surrounding atmosphere, and thus heat the printed circuit boards more quickly and evenly, or to inject the substantially non-oxidizing atmosphere, for example at substantially ambient temperature or even to have no preheating on this side and no gas injection on said side.

According to another preferred embodiment of the invention, the preheated gas atmosphere is generated by injection of a laminar flow of substantially inert gas in a plenum chamber, said chamber comprising a bottom perforated wall, heater means and gas injection means, which are so related to each other that the gas is heated by convection by the heater means, the pressure of the heated gas inside the plenum chamber being slightly higher than the pressure of the gaseous atmosphere outside said chamber, the heated gas thus flowing laminarly through the openings of the perforated wall of the plenum chamber. These openings are chosen such that the Reynolds number of the laminar flow is maintained between 500 and 2,500, which might be carried out by using about 60 holes per zone having a diameter between about 0.2 mm to 0.4 mm.

According to another embodiment of the invention, the preheated gas atmosphere is generated by injection of laminar flow of substantially inert gas in a plenum chamber, said plenum chamber comprising a bottom perforated wall, heating means integral with the perforated wall and gas injection means which are so related to the heating means that the gas is heated at least partly, by the perforated wall, the pressure of the gaseous atmosphere inside the plenum chamber being higher than the pressure of the gaseous atmosphere outside the plenum chamber, the heated gas thus flowing laminarly through the openings of the perforated wall of the plenum chamber.

According to a preferred embodiment of the invention, the plenum chamber comprises from top to bottom, in substantially parallel plans the top wall of the chamber, the heating means, the gas injection means, and the perforated wall. The heating means are for example heating registers usually used in heating ovens. The gas injection means are preferably in the form of a pipe or manifold arranged at least on three sides of the plenum chamber, this manifold is provided with holes for inert gas diffusion in the plenum (first stage diffusion) said holes being arranged on the top half of said manifold, preferably located on a diameter of said manifold parallely oriented to the perforated wall. However, when the heating means are integral with the bottom perforated wall of the plenum chamber it is possible to inject the nitrogen gas in any direction.

According to one preferred embodiment of the invention a substantially non-oxidizing atmosphere is nitrogen gas comprising less than 3% of oxygen, preferably less than 1000 ppm and most preferably less than 10 ppm of oxygen. In order to avoid dross formation in the area of the solder pot, various experiments have shown that an oxygen concentration in the nitrogen gas in the area of the wave should be less than 10 ppm of oxygen and most preferably about 5 ppm. In order to keep the purity of the nitrogen gas injected into the wave soldering machine, it is preferable to have separate zones, which zones are separated from each other by curtains, gas curtains, etc. However, as the oxygen content in the nitrogen atmosphere (or the inert gas) is less important in the preheating zones and/or the cooling zone than the solder zone, it is possible to have in these preheating zones, or at least some of them, and/or the cooling zones, or at least some of them, a nitrogen atmosphere comprising more than 10 ppm of oxygen. This is particularly advantageous when, for example, several wave soldering machines are close to each other or are located in the same plant, having a common nitrogen or inert gas source. In these conditions, lit is possible to have for example an injection of pure or substantially pure nitrogen (less than 1 ppm oxygen usually), in the wave soldering zone, for example nitrogen from a bulk liquid nitrogen vessel, while the rest of the nitrogen gas at lower purity is provided by a membrane generator or a PSA.

Of course, in the case of very large plants utilizing tens of wave soldering machines at the same time, it is also possible to have at least the solder zone of these machines connected to an on-site nitrogen plant, for example a cryogenic on-site nitrogen plant.

BRIEF DESCRIPTION OF THE DRAWINGS

FIG. 3 shows one embodiment of gas injection means in a gas plenum chamber without heating means.

DESCRIPTION OF THE PREFERRED EMBODIMENTS

Figures 1, 3A, 3B:
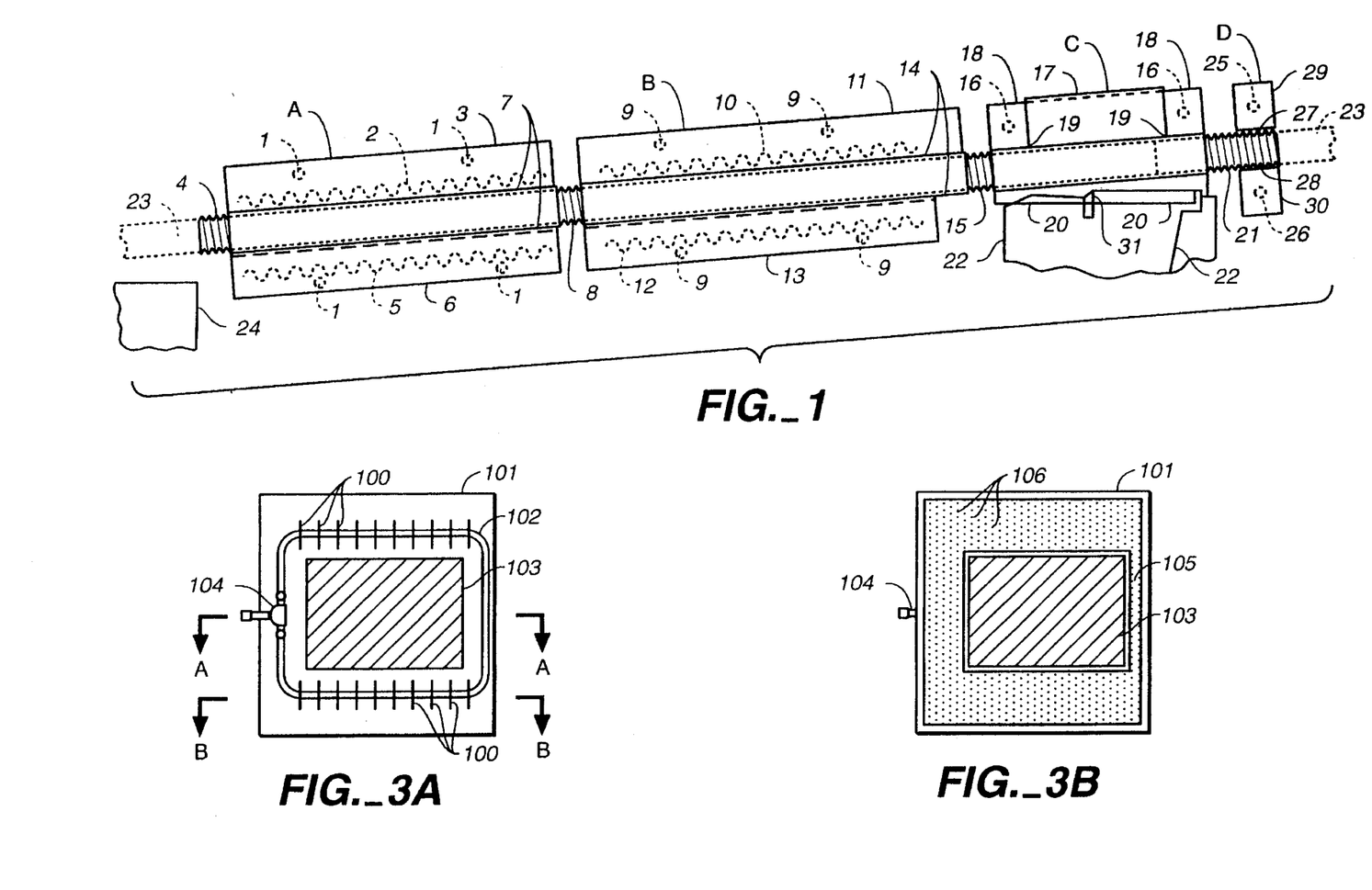
FIG. 1 is a front view of the cross section of the machine comprising the various nitrogen injection manifolds and preheaters means.

FIG. 1 represents a schematic drawing (side-view) of a wave soldering machine capable of carrying out a process according to the invention comprising two preheat zones A and B, a solder zone C, and a cooling zone D. The circuit boards are transported on wave solder rails 23 and enter the first preheat zone A through the entrance curtains 4. This first preheating zone (and other zones too) totally surrounds the transportation rails in order to provide a controlled atmosphere shielding the circuit boards travelling through it. The first preheat zone A comprises a top side skin 3 and a bottom side skin 6 with gas tubing manifolds 1 as disclosed on FIG. 4, said tubing being close to the walls of the respective skins 3 and 6. Heating topside coil 2 and bottom side coil 5 are arranged between the gas tubing manifolds and the gas diffusing perforated plate which diffuses the controlled atmosphere above and under the circuit boards.

The second preheat zone B is substantially similar to the first preheat zone A with a topside skin 11, a bottom side skin 13, topside and bottom side heating coils 10, respectively 12, gas diffusing manifolds 9 (top and bottom) and gas diffusing plates 14 (top and bottom) with a curtain system 8 between A and B, similar to the entrance curtain system 4.

Separating the second preheat zone B and the solder zone C is the solder zone curtain system 15 (the curtain system substantially prevents air ingress in these various zones): it is made of parallel vertical curtains, each of them being made of separate, parallel strips in a substantial sealing contact, one with another.

The solder zone C comprises a solder zone skin 18 covering essentially the overall area where the molten solder is exposed to an atmosphere, in the solder pot 22. A solder pot seal 20 is provided between the bottom of the two lateral wave solder rails and the solder bath, comprising the solder wave(s) 31, in order to prevent air ingress above the solder bath.

The solder zone skin 18 comprises also a solder zone gas diffusing manifold 16 extending all around and closely to the vertical walls of the skin 18. To provide a visual control during the soldering operation, this skin 18 has a solder zone window 17, the solder zone gas diffusing plate 19 extending horizontally from the external wall on a short distance and then vertically up to the top wall of the skin 18, which is level with the sides of the window 17, said gas diffusing plate thus surrounding the gas diffusing manifold 16.

An exit curtain system 21 is provided from the solder zone C exit through the cooling zone D to prevent also air ingress. This cooling zone D comprises also a topside skin 29 and a bottom side skin 30 with a topside gas diffusing manifold 25 and a bottom side gas diffusing manifold 26, with topside and bottom side gas diffusing perforated plates 27 and 28, respectively. Both the solder zone C and the cooling zone D do not comprise heating means, because the solder zone is kept hot by the heat transferred to the controlled atmosphere by the molten solder and the cooling zone provides some cooling gas circulating through the manifolds 25 and 26, and diffusing through the plates 27 and 28 to cool down the circuit boards and bring them to a temperature where they are no longer oxidized (or rapidly oxidized) by the ambient air.

Figure 2:
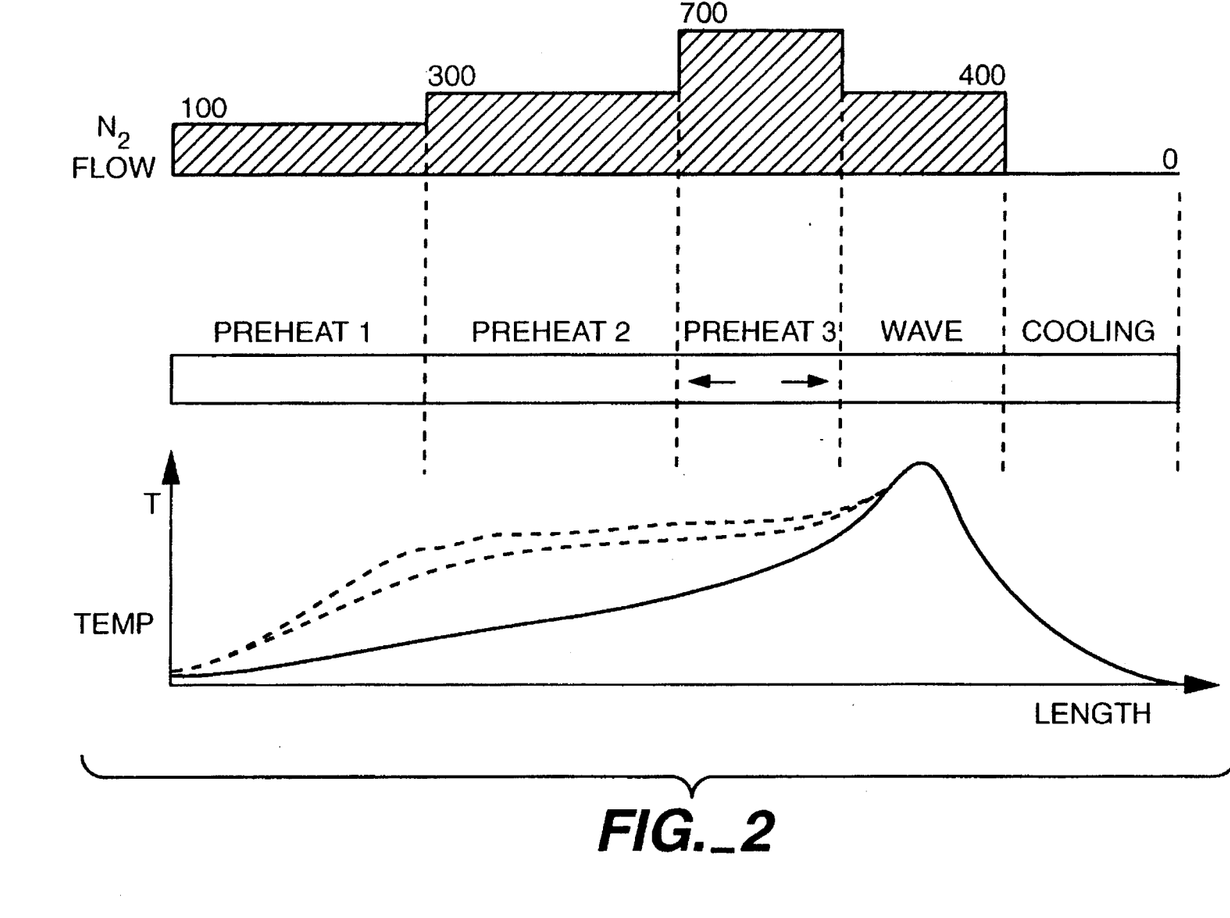
FIG. 2 is a graphic representation of the temperature profile throughout the wave soldering machine.

FIG. 2 represents a temperature profile along the length of the wave soldering hood system (as exemplified on FIG. 1), but comprising in this present example, three preheating zones (instead of two as shown on FIG. 1), a wave solder zone and a cooling zone.

Nitrogen gas (used here as the inert gas to flow throughout the manifold gas diffuser) at a flow rate of 100 scfh is injected in the first preheat zone through the gas manifold, heated by radiation of the heating coil in the top skin (and bottom skin if necessary), then by conduction while traversing through the holes of the diffuser plates (heated by the heating coils). A flow rate of 200 scfh of the same gas as used in the first preheat zone (or a different inert gas, usually with less oxygen in it if the first gas used was "impure" nitrogen, i.e. 97 to 99% $N_2$ with 1 to 3% $O_2$) is injected in the same way in this second preheat zone, then a flow rate of 700 scfh is injected in the third zone (same purity or even less $O_2$). Increasing the flow rate means increasing the heat transfer between the atmosphere and the circuit board travelling from the entrance of the system to the wave zone and then progressively increasing the temperature of the circuit board and the outside of the components that this board bears. Then the heat transfer phenomena continues even when the flow rate of inert gas (which always remains laminar or substantially laminar throughout the process) is decreased to, e.g. 400 scfh because of the presence in this soldering zone of the solder pot at about 300° C. The cooling step is conducted in the present example with a zero flow rate of nitrogen injected in the gas diffuser of this cooling zone. However, inert gas flows from the third preheat zone and the wave zone through this cooling zone to exit the system through the curtains of the cooling zone.

FIG. 3 a & b represents the gas diffuser system used over the solder pot system, and comprising a plenum lid 101, a tubing manifold 102, having a rectangular shape and surrounding the window 103 through which the solder bath can be observed.

This manifold 102 comprises holes 100 regularly spaced (respectively on the top and bottom sides of the rectangular manifold on the drawing). The rectangular manifold 102 comprises a gas inlet tee 104.

FIG. 3a represents a top view of the gas diffuser system, while FIG. 3b represents the bottom view of the same diffuser system. On this FIG. 3b, the diffuser plate 105 covers the manifold 102, sealingly surrounding the window 103, the gas flowing from the holes of the manifold, then flowing only through the holes 106 of the perforated diffuser plate 105. When heating means are provided inside the plenum (as exemplified on FIG. 4), the inert gas is thus also heated (by conduction) when it flows through the holes, such as 106, in the diffuser plate 105.

The gas diffuser system of the preheat zones is similar to the system disclosed on FIG. 3 a & b, except that there is usually no window in the top of the lid 101, which allows having a continuous, usually substantially flat diffuser plate 105 covering substantially the whole surface of the lid and comprising holes, usually regularly spaced all over the surface of the plate. It is possible to provide different sizes and different patterns of holes if a flow of gas having a preferred pattern is desired.

Figure 4:
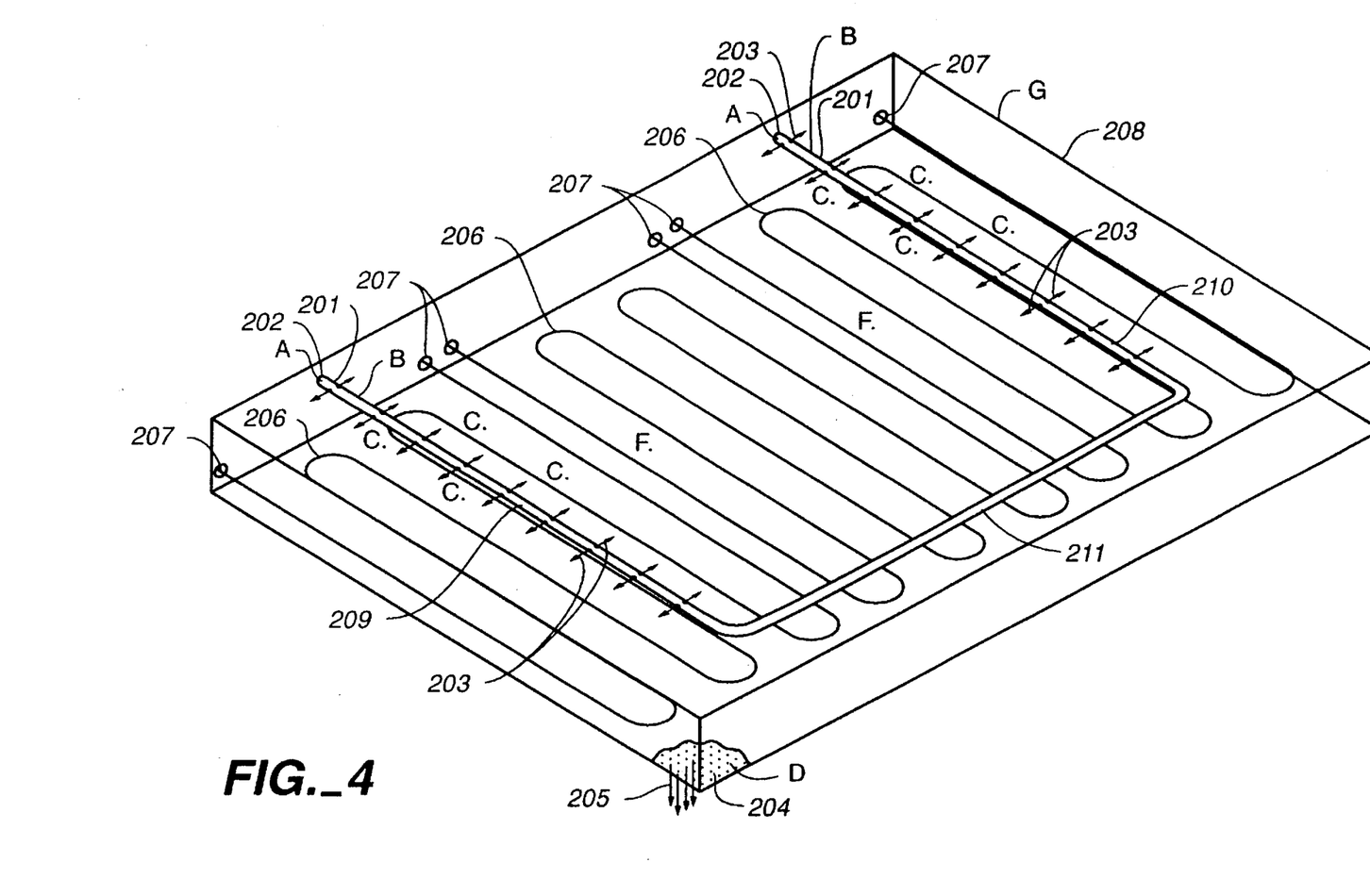
FIG. 4 represents an overall view of a gas plenum chamber for injection of preheated inert gas atmosphere in the wave soldering machine.

FIG. 4 is an overall view of a plenum used as a top and/or bottom plenum in the preheat zones of the machine as disclosed on FIG. 1. The plenum 208 (which is a parallelepipedic box having plain walls, except the bottom wall 204 which is perforated) comprises from the top to the bottom a gas manifold 201 comprising regularly spaced holes 203 in its branches 209 and 210, which holes are usually disposed in a plane which is parallel to the perforated bottom 204. The branch 211 of the manifold usually comprises no holes (for gas diffusion). The inert gas enters into the manifold in 202 and exits the manifold at 203 (or vice versa). The inlet 202 and outlet 203 are usually not too close from the side (vertical) walls of the housing 208, the design being such that the repartition of the gas in the plenum is even and no turbulences generated in it. The inlet and outlet 202 and 203 (or vice versa) are connected to a source of inert gas (e.g. nitrogen). Lying between the gas manifold 201 and the perforated bottom plate 204 are several heating coils 206 connected through their connections 207 to an adequate source of electric power. These coils lie parallel (or substantially parallel) to the bottom plate 204, at a close distance to increase heat transfer with the perforated plate without disturbing the gas flow which must (preferably) remain laminar or substantially laminar at the output of the holes or slits in the perforated bottom plate 204.

Examples:

In order to evidence the improvement provided by the invention, different experiments have been conducted in the same machine comprising a gas plenum chamber as exemplified on FIG. 4 in the soldering zone, just above the solder pot.

The experiment disclosed hereunder was performed to show the advantage of using a forced convection laminar flow of heated inert gas as a more effective heat transfer medium over radiation. Forced convection laminar flow (of heated inert gas) can be defined as a flow of inert gas having a pressure drop from 0.1 inch of water to 50 inches of water across the plenum plate, which means a velocity substantially between 1 and 30 m/s.

The test was run with printed circuit boards in fiberglass/epoxy resin (FR 4 type) with small components and large components on the same board.

Figure 5:
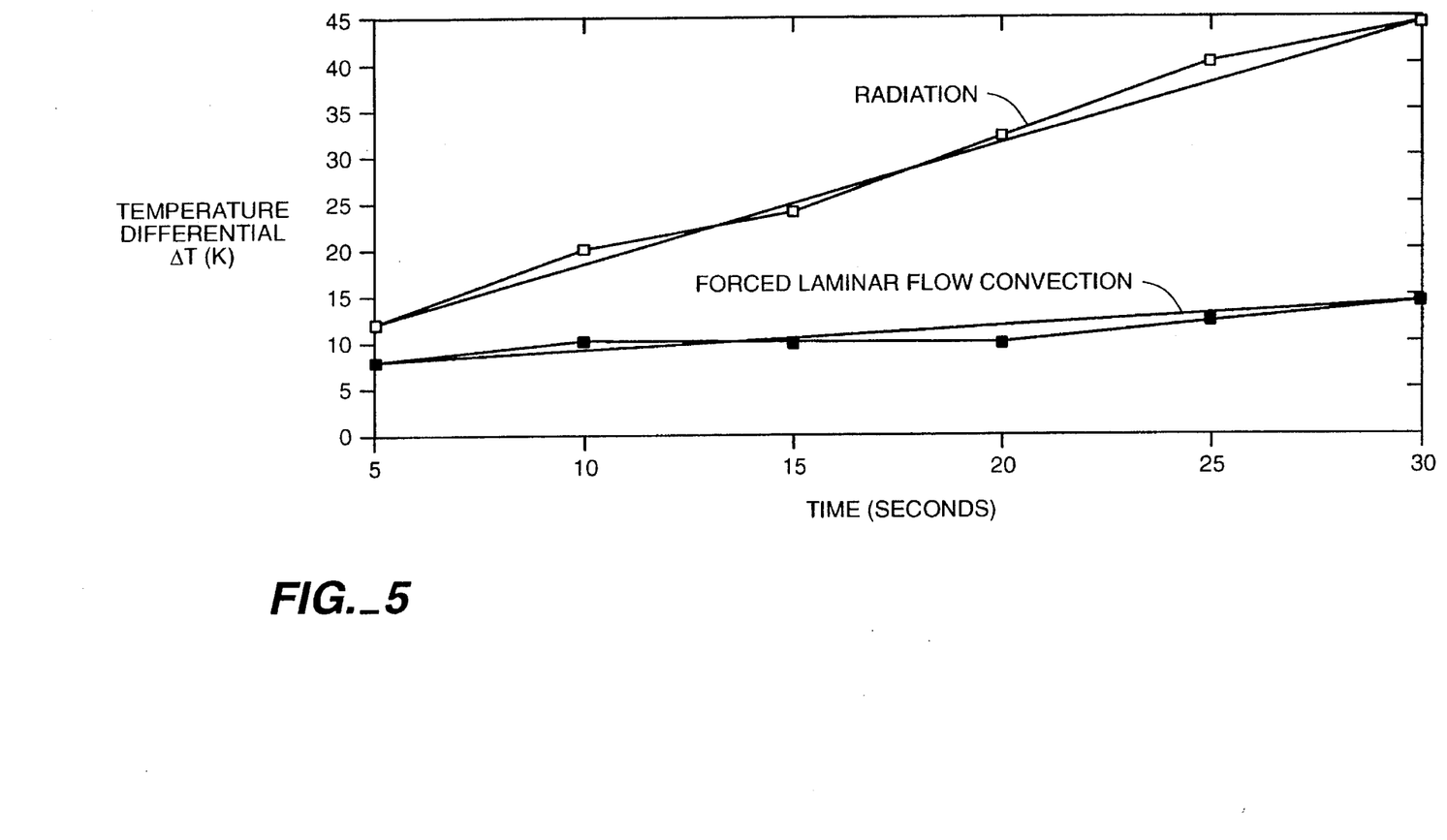
FIG. 5 represents the temperature differential versus time for heat provided by radiation and by forced laminar flow convection.

FIG. 5 represents the results obtained in both cases of heat provided to the components by direct radiation of the heaters and no gas injection in the plenum and of heat provided by forced laminar flow convection by injection of nitrogen gas which is heated in the plenum and which flows onto the circuit board.

It can be seen from FIG. 5 that the temperature difference $\Delta T$ for the radiation case is much larger as a function of time vs. the $\Delta T$ for that of convection. It is this temperature differential that the laminar preheated forced convection flow (of a substantially non-oxidizing gas) will prevent. This temperature differential shows that by using this system, the temperature across the board can be controlled to eliminate the possibility of defects due to overheating or underheating. The temperature differential $\Delta T$ represents the difference of temperature between the two sides (top and bottom) of the components. This $\Delta T$ is about 15° C. (or less) with forced laminar flow convection of an inert gas after 30 seconds of contact with the heated gas, while for radiation, there is a quite instantaneous $\Delta T$ of about 15° C. (at time zero) to reach about 43° C. after 30 seconds.

Figure 6A:
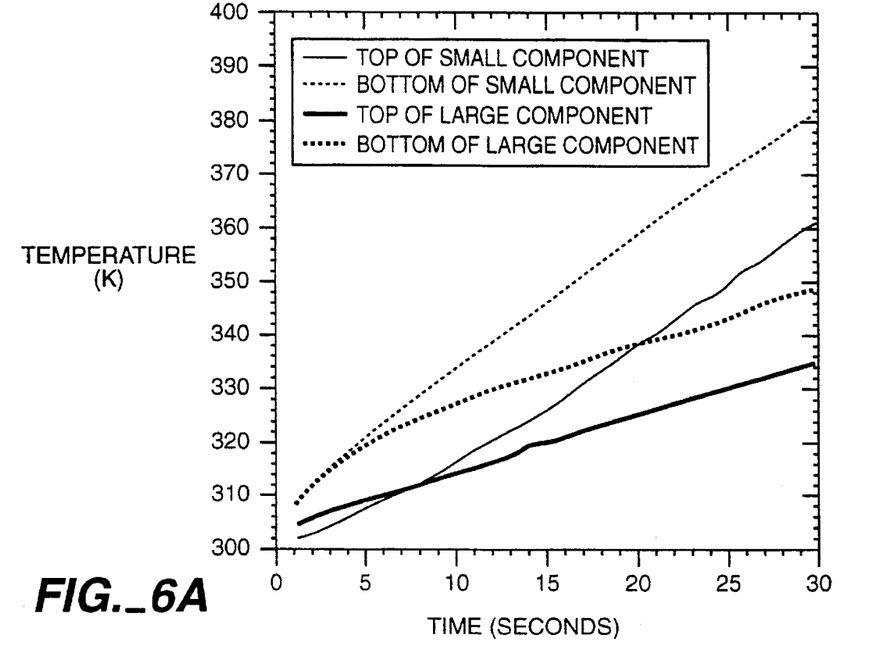
FIG. 6 exemplifies the advantages of the forced laminar flow convection.
Figure 6B:
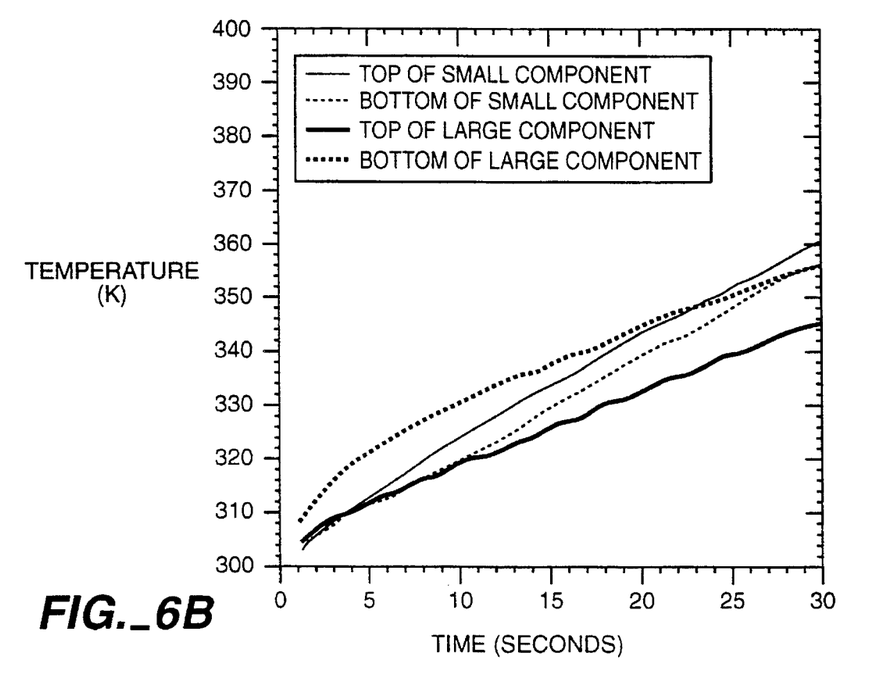

FIG. 6a and 6b represent respectively the temperature in Kelvin versus time in seconds for heat generated and conveyed to the circuit board by radiation only and heat conveyed to the circuit board by forced laminar flow convection. In the case of FIG. 6a, the source of temperature is heated to 600K (convection only), while in the case of FIG. 6B, the source of temperature is heated at 500K only, i.e. 100K lower. The final goal in both cases is to reach a temperature of an average value on the components of the board of about 355K (keeping the same temperature of 600K for the heating elements in the case of FIG. 6b could have meant reaching faster (less than 30 seconds) the targeted temperature of 355K).

It can be seen from FIG. 6b that the temperature differential varies with the size of components when a preheated substantially non-oxidizing laminar flow of gas is used. The two components that were evaluated varied in size as well as material composition. The temperature measurements were made at two locations for each component.

FIG. 6a exemplifies radiation heat transfer. The large variation in temperature gradients within the components indicate that the component undergoes undue stress to achieve the desired temperature for soldering to take place. Because of the variation in material properties within a single component, this type of stress will lead to premature component failure.

FIG. 6b exemplifies forced laminar convection. In this case, the temperature gradient variation is substantially reduced over that of the radiation case only. The reduction in temperature difference within a component will lead to greater components reliability.

We claim:

1. A wave soldering process comprising providing a substantially non-oxidizing atmosphere in a wave soldering machine, and electrically and mechanically connecting through-hole components or surface mount components or both to a printed circuit board by applying a solder in liquid state and further solidifying said solder in order to electrically connect the components and mechanically maintain the components on the printed circuit board, wherein said machine comprises at least one preheating zone to preheat the printed circuit boards; at least one soldering zone including a solder pot to solder the components to the board; and at least one cooling zone to cool and solidify the solder, and wherein the process further comprises controlling the temperature of said substantially non-oxidizing atmosphere and exposing said at least one preheating zone and said at least one soldering zone including the solder pot to laminar forced convective flow in order to increase the thermal efficiency of the heat transfer from the atmosphere to the printed circuit board.

2. A process according to claim 1, further comprises injecting said substantially non-oxidizing atmosphere in at least one zone of said machine.

3. A process according to claim 1, wherein the temperature of said substantially non-oxidizing atmosphere is greater than the ambient temperature, further comprising injecting said substantially non-oxidizing atmosphere in at least one of the preheating zones of said machine.

4. A process according to claim 1, wherein the temperature of said substantially non-oxidizing atmosphere is lower than or equal to the ambient temperature further comprising injecting said substantially non-oxidizing atmosphere in at least one of the cooling zones of said machine.

5. A process according to claim 1, further comprising providing said substantially non-oxidizing atmosphere to said machine after preheating under said laminar flow conditions.

6. A process according to claim 1, further comprising maintaining the temperature of said substantially non-oxidizing atmosphere at a preset value.

7. A process according to claim 1, further comprising gradually increasing the temperature of the printed circuit boards to reach a maximum in the solder zone and gradually decreasing the temperature of said substantially non-oxidizing atmosphere, upon exiting the solder zone, the temperature of said substantially non-oxidizing atmosphere in a preheating zone being lower than that of the subsequent zone.

8. A process according to claim 1, wherein at least some of the printed circuit boards comprise SMT components on the top sides of the printed circuit boards.

9. A process according to claim 1, further comprising injection of a preheated gas atmosphere on both sides of the printed circuit board in at least one of the preheating zones.

10. A process according to claim 1, wherein the laminar forced convective flow is a flow having a Reynolds number between 500 and 2500.

11. A process according to claim 1, wherein the temperature of the substantially non-oxidizing atmosphere injected in the various zones of said machine is different from one zone to another.

12. A process according to claim 11, further comprising injecting said substantially non-oxidizing atmosphere in a wave soldering machine comprising at least two preheating zones, wherein the temperature of said substantially non-oxidizing atmosphere injected in the different preheating zones is different from one zone to another.

13. A process according to claim 1, wherein the composition of said substantially non-oxidizing atmosphere injected in the various zones of said machine is different from one zone to another.

14. A process according to claim 13, further comprising injecting a substantially non-oxidizing atmosphere is in a wave soldering machine comprising at least two preheating zones, the temperature of the atmosphere injected in the different preheating zones being different from one zone to another.

15. A process according to claim 1, further comprising creating the preheated gas atmosphere by injecting a laminar flow of substantially inert gas in a plenum chamber, said chamber comprising a bottom perforated wall, heater means and gas injection means which are so related that the gas is heated in contact with the heater means, the pressure of heated gas inside the plenum chamber being slightly higher than the pressure of the gaseous atmosphere outside said chamber, the heated gas thus flowing laminarly through the openings of the perforated wall of the plenum chamber.

16. A process according to claim 15, wherein the heating means comprises heating rods parallely arranged inside the plenum and arranged in a plane substantially parallel to the perforated wall and gas injection means in the form of pipes parallely arranged between heating rods, said pipes comprising openings arranged on the top half of said pipe.

17. A process according to claim 1, further comprising creating the preheated gas atmosphere by injecting a laminar flow of substantially inert gas in a plenum chamber, said plenum chamber comprising a bottom perforated wall, heating means integral with the perforated wall and gas injection means which are so related to the heating means that the gas is heated in contact with the perforated wall, the pressure of the gaseous atmosphere inside the plenum being higher than the pressure of the gaseous atmosphere outside the plenum, the heated gas thus flowing laminarly through the openings of the perforated wall of the plenum.

18. A process according to claim 17, wherein the gas injection means is in the form of a pipe comprising openings arranged at any place of the surface of said pipes.

19. A process according to claim 1, further comprising injecting a preheated gas atmosphere on the top side of the printed circuit boards in at least one of the preheating zones.

20. A process according to claim 19, further comprising also preheating the bottom side of the printed circuit boards in at least one of the preheating zones.

21. A process according to claim 19, further comprising injecting a non-preheated atmosphere on the bottom side of the printed circuit board in at least one of the preheating zones.

22. A process according to claim 1, further comprising injecting a preheated gas atmosphere on the bottom side of the printed circuit board in at least one of the preheating zones.

23. A process according to claim 22, further comprising injection a non-preheated atmosphere on the top side of the printed circuit board in at least one of the preheated zones.

* * * * *

UNITED STATES PATENT AND TRADEMARK OFFICE
CERTIFICATE OF CORRECTION

PATENT NO. : 5,520,320
DATED : MAY 28, 1996
INVENTOR(S) : KEVIN McKEAN ET AL.

It is certified that error appears in the above-identified patent and that said Letters Patent is hereby corrected as shown below:

In col. 10, line 62, please delete "the" and insert --said--.

In col. 11, line 9, please delete "is".

In col. 11, line 29, please delete "pipe" and insert --pipes--.

In col. 12, line 12, please delete "pipes" and insert --pipe--.

In col. 12, line 28, after "injection" insert --of--.

Signed and Sealed this

Nineteenth Day of November, 1996

Attest:

BRUCE LEHMAN

Attesting Officer          Commissioner of Patents and Trademarks